(12) United States Patent
Lysaght et al.

(10) Patent No.: US 7,576,558 B1
(45) Date of Patent: Aug. 18, 2009

(54) APPARATUS AND METHOD FOR ENHANCED READBACK OF PROGRAMMABLE LOGIC DEVICE STATE INFORMATION

(75) Inventors: Patrick Lysaght, Los Gatos, CA (US); Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/056,560

(22) Filed: Mar. 27, 2008

(51) Int. Cl.
*H03K 19/003* (2006.01)
(52) U.S. Cl. .................. 326/9; 326/16; 326/38
(58) Field of Classification Search .......... 326/9, 326/14–16, 38–41
See application file for complete search history.

(56) References Cited

U.S. PATENT DOCUMENTS 6,704,889 B2 * 3/2004 Veenstra et al. .......... 714/39
7,512,850 B2 * 3/2009 Redgrave et al. ........ 714/725

* cited by examiner

*Primary Examiner*—Anh Q Tran
(74) *Attorney, Agent, or Firm*—Michael T. Wallace (57) ABSTRACT

A method and apparatus is provided to significantly increase the flexibility of readback capture mechanisms, the apparatus being an integrated circuit device, comprising a configuration data router coupled to receive at least one configuration data frame from a configuration interface, a configuration memory space coupled to the configuration data router and adapted to receive the configuration data frame to define a user logic block and a capture block within the programmable logic device, the user logic block including, a monitor control block coupled to the capture block and adapted to report activity within the user logic block to the capture block, and a configuration control logic block coupled to the capture block that is adapted to assert the capture signal in response to the asserted alert signal.

21 Claims, 6 Drawing Sheets

APPARATUS AND METHOD FOR ENHANCED READBACK OF PROGRAMMABLE LOGIC DEVICE STATE INFORMATION

FIELD OF THE INVENTION

The present invention generally relates to programmable logic devices (PLDs), and more particularly to PLDs that are adapted for enhanced readback of state information.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, digital clock managers (DCMs), Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration data bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Verification of the configuration data that is used to configure the FPGA into a particular design is often required, so as to obviate the possibility of a flawed design configuration due to a corrupted configuration bitstream. Thus, a procedure known as readback verify is provided, whereby during a configuration event, a configuration bitstream may be downloaded into a configuration memory space through a configuration controller that is configured for write mode. Next, the downloaded configuration bitstream may be verified by configuring the configuration controller for read mode, whereby the contents of the configuration memory space are obtained through the same configuration interface that was used during the configuration event. The configuration data obtained through readback verify may then be compared to the original configuration data to determine whether any bit errors occurred during the configuration event.

Additionally, verification of the functionality of a design may also be required to determine whether a particular user design meets certain design criteria. As such, a procedure known as readback capture may be used as a superset of readback verify, whereby in addition to the configuration data contained within the configuration memory space, the current state data of all CLB and IOB registers may also be obtained. Thus, readback capture is a procedure that is valuable during design debugging operations, for example, whereby a portion of the current state data of a particular user design may be decoded to determine whether the user design is functioning as anticipated.

Readback verify and readback capture, however, are each controlled by the configuration controller, which imposes global restrictions on the functionality and subsequent usability of the readback verify and capture procedures. In particular, IOB/CLB flip-flop state data may be requested via the configuration controller, but the flip-flop state data of the entire FPGA is returned by such a request.

If readback capture is not required or permitted from certain portions within the FPGA, then those portions are "masked" by the design software. In one example, the logic content of certain primitive logic resources, such as look-up table RAM (LUTRAM) resources, is destroyed by the execution of a read cycle on the corresponding configuration data frame. As such, the design software prohibits readback capture of LUTRAM resources within the FPGA, so as to avoid destruction of the LUTRAM logic content. For all other logic resources contained within the FPGA, the design software determines whether to discard, ignore, or mask the configuration data.

Additionally, while conventional readback capture procedures allow for the readback of certain logic resources, such as BRAM resources, the BRAM resources cannot be accessed by the user logic during the readback capture procedure. Thus, readback capture functionality of the BRAM resources is somewhat inhibited.

Efforts continue, therefore, to provide greater flexibility for readback capture procedures, so as to allow independently controlled readback capture of user defined regions. Further, previously inhibited logic resources should be made available for readback capture so as to increase effectiveness during debugging sessions.

SUMMARY OF THE INVENTION

To overcome limitations in the prior art, and to overcome other limitations that will become apparent upon reading and understanding the present specification, various embodiments of the present invention disclose an apparatus and method for enhanced readback of programmable logic device state information.

In accordance with one embodiment of the invention, a programmable logic device comprises a configuration data router that is coupled to receive at least one configuration data frame from a configuration interface and a configuration memory space that is coupled to the configuration data router and is adapted to receive the at least one configuration data frame to define a user logic block and a capture block within the programmable logic device. The user logic block includes a monitor control block that is coupled to the capture block and is adapted to report activity within the user logic block to the capture block. The capture block is adapted to assert an alert signal in response to the reported activity from the monitor control block. The user logic block further includes a capture control block that is coupled to the configuration memory space and is adapted to deliver state data contained within the user logic block to the configuration memory space in response to an asserted capture signal. The programmable logic device further comprises a configuration control logic block that is coupled to the capture block, the configuration control logic block being adapted to assert the capture signal in response to the asserted alert signal.

In accordance with another embodiment of the invention, a method is provided for readback capture of programmable logic device state data. The method comprises configuring logic regions within the programmable logic device, each logic region being configured to store state data relating to activity within each logic region. The method further comprises providing a monitor signal from each logic region, the monitor signal being indicative of the activity within each respective logic region. The method further comprises configuring a capture block for each logic region to receive the monitor signal, each capture block being responsive to assert an alert signal in response to specific activity within each respective logic region. The method further comprises asserting a capture signal in response to the asserted alert signal to capture the state data of each logic region within a configuration memory space of each respective logic region.

In accordance with another embodiment of the invention, an integrated circuit comprises a configuration data router that is coupled to receive a plurality of configuration data frames from a configuration interface. The integrated circuit further comprises a plurality of configuration memory spaces that are coupled to the configuration data router, each configuration memory space being adapted to receive at least one configuration data frame to define a user logic block and a capture block associated with each configuration memory space. Each user logic block includes a monitor control block that is coupled to the capture block and is adapted to report activity within the user logic block to the capture block. The capture block is adapted to provide an alert signal in response to the reported activity from the monitor control block. Each user logic block further includes a capture control block that is coupled to a respective configuration memory space and is adapted to deliver state data contained within the user logic block to the respective configuration memory space in response to an asserted capture signal. The integrated circuit further comprises a capture controller that is coupled to each configuration memory space and is adapted to retrieve the state data from each of the plurality of configuration memory spaces.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided to significantly increase the flexibility of the readback capture mechanism by adding one or more capture blocks within a user design. Each capture block may be instantiated using reconfigurable logic ("soft" logic) within the user domain, or conversely, may be instantiated within non-configurable logic ("hard" logic) using hard logic devices, such as random access memory blocks (BRAMs), digital clock managers (DCMs) and/or phase-locked loops (PLLs). Combinations of hard and soft logic may also be utilized to enhance functionality of the capture blocks.

In a first embodiment, capture blocks may be instantiated within multiple logic regions within the PLD, so as to provide independent readback capture for each logic region. The size of the logic region may also be configured to encompass the entire PLD on one extreme, or conversely, may be configured to encompass the smallest configurable portion of the PLD, i.e., one configuration frame, on the other extreme. Thus, independent trigger points may be established for each logic region, whereby readback capture from one logic region does not corrupt the trigger and subsequent readback capture from another logic region.

In an alternate embodiment, trigger points of multiple logic regions may be cascaded. For example, once a first capture block of a first logic region is triggered, a second capture block of a second logic block may be armed in response to the triggered first capture block. Once the second capture block is triggered, then a third capture block of a third logic region is armed, and so on. As such, triggers may be cascaded throughout a user logic design to create dependent trigger events.

In an alternate embodiment, capture functionality may be instantiated within DCMs (or equivalently within PLLs or a combination of DCMs and PLLs), whereby for example, trigger points may be specified to occur after an arbitrary number of clock cycles have elapsed. For example, each DCM of the PLD may provide one or more clock count triggers that correspond to the various phase variants of clock signals provided by the DCM. In such an instance, the hard logic block DCM, or conversely, a soft logic block configured in conjunction with the DCM, may provide a clock count trigger signal after an arbitrary number of clock cycles have occurred for a particular DCM clock output signal. Once received, a capture block configured within the logic region may utilize the clock count trigger as an arming signal for an additional capture event that may be synchronous with the DCM clock output signal received by the logic region. As such, both global and local triggering capabilities are utilized to enhance temporal and spatial triggering facilities within the PLD.

It is noted here that, in embodiments of the present invention, clock signals can be generated by variety of circuits. As shown above, DCMs and PLLs can generate clock signals. In a programmable logic device, clock signals can be generated by blocks of configured programmable fabric within the device. Multiple clock signals can be generated by multiple instantiations of any of the above or a variety of combinations of the above. Clock signals from any source can be employed in various embodiments and reference to a particular source in this detailed description is not intended to preclude the implementation of any other source.

In alternate embodiments, capture mechanisms are instantiated within hard logic devices, such as BRAMs, or conversely as soft logic blocks configured in conjunction with the BRAMs, so as to facilitate readback capture access to state data contained within the BRAMs. In one embodiment, for example, first and second BRAMs are configured with the same initial configuration. The first BRAM is selected as the primary BRAM and the second BRAM is selected as a direct mirror to the primary BRAM, such that each write operation performed on the first BRAM is mirrored onto the second BRAM. As such, the contents of the second BRAM may be targeted by the capture mechanism for debug/inspection procedures, whereby after a trigger point is reached, data is retrieved for debug/inspection while the first BRAM continues to capture state information during user logic activity.

In an alternate embodiment, a single BRAM may instead be utilized, whereby first and second halves of the BRAM are configured with the same initial configuration. The first half of the memory space of the BRAM remains active to capture state information of user logic activity, while the second half of the memory space of the BRAM is accessed by the capture mechanism. For example, the bottom half of the memory space of a single BRAM may be allocated to user logic, whereas the top half of the memory space of the BRAM may be allocated to the capture mechanism. Each write operation to the bottom half of the BRAM causes a corresponding write operation to the top half of the BRAM. Once a trigger point is reached, the capture mechanism accesses data from the top half of the BRAM.

Alternate embodiments allow for the use of a second BRAM, or conversely, a portion of the memory space of a single BRAM, to record only the changes, i.e., deltas, in data values to the primary BRAM. Once a readback capture is requested, the capture mechanism transparently discontinues generating deltas and writes the correct state information into the capture memory space prior to capturing the state information for readback. In another embodiment, a journaling mechanism may be used to facilitate state data shadowing of the primary BRAM during a readback capture.

Figure 1:
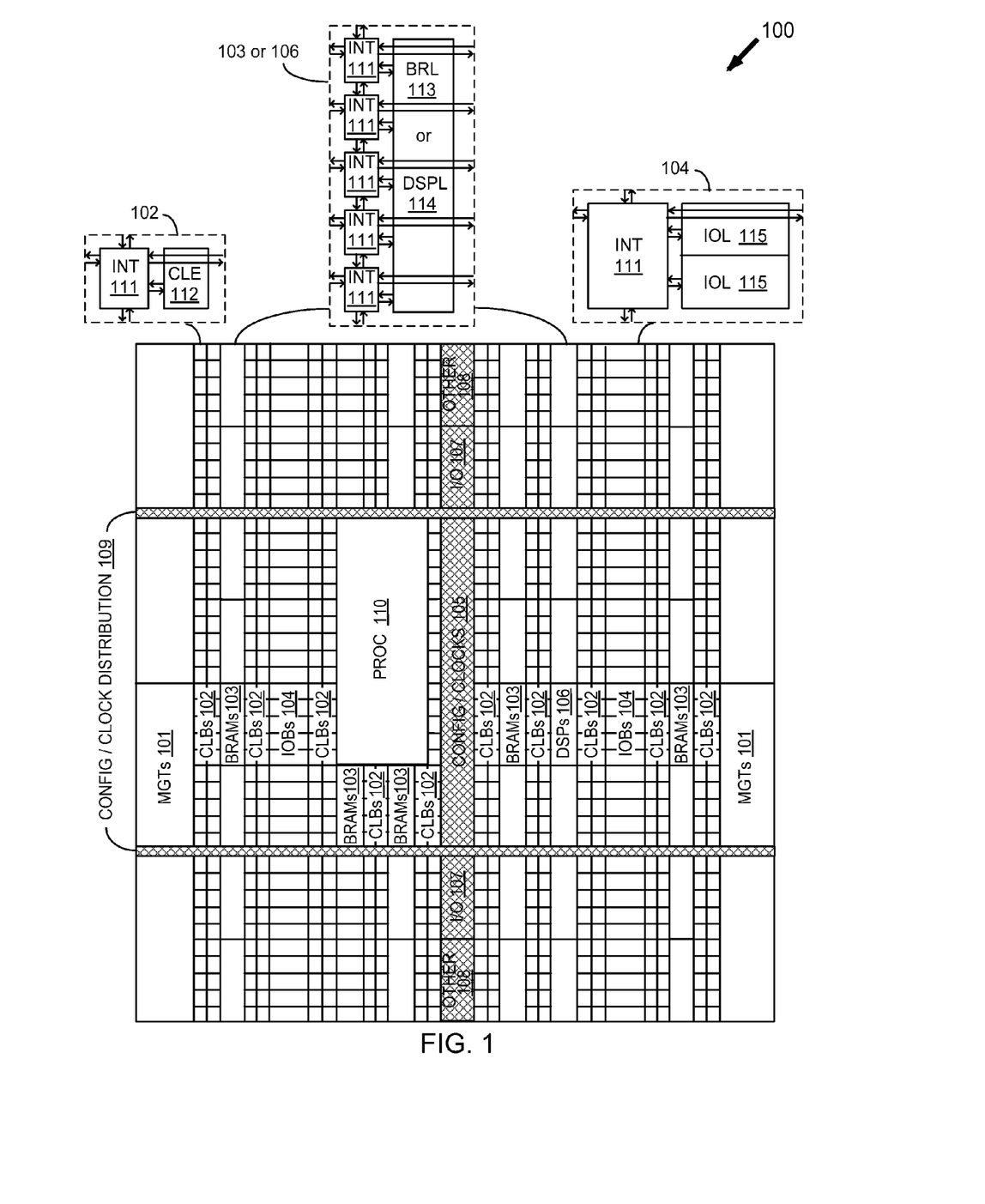
FIG. 1 illustrates an exemplary Field Programmable Gate Array (FPGA) architecture.

As noted above, advanced FPGAs can include several different types of programmable logic blocks in the array. For example, FIG. 1 illustrates an FPGA architecture 100 that includes a large number of different programmable tiles including multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers (DCMs), Phase-Locked Loops (PLLs), analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA. For example, the various phase variants of clock signals generated by the DCMs and/or the PLLs of the FPGA may be distributed to various user logic regions that may be configured across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs are typically included wherever the CLBs appear, to facilitate the efficient implementation of user logic, but the number of adjacent CLB columns varies with the overall size of the FPGA.

Figure 2:
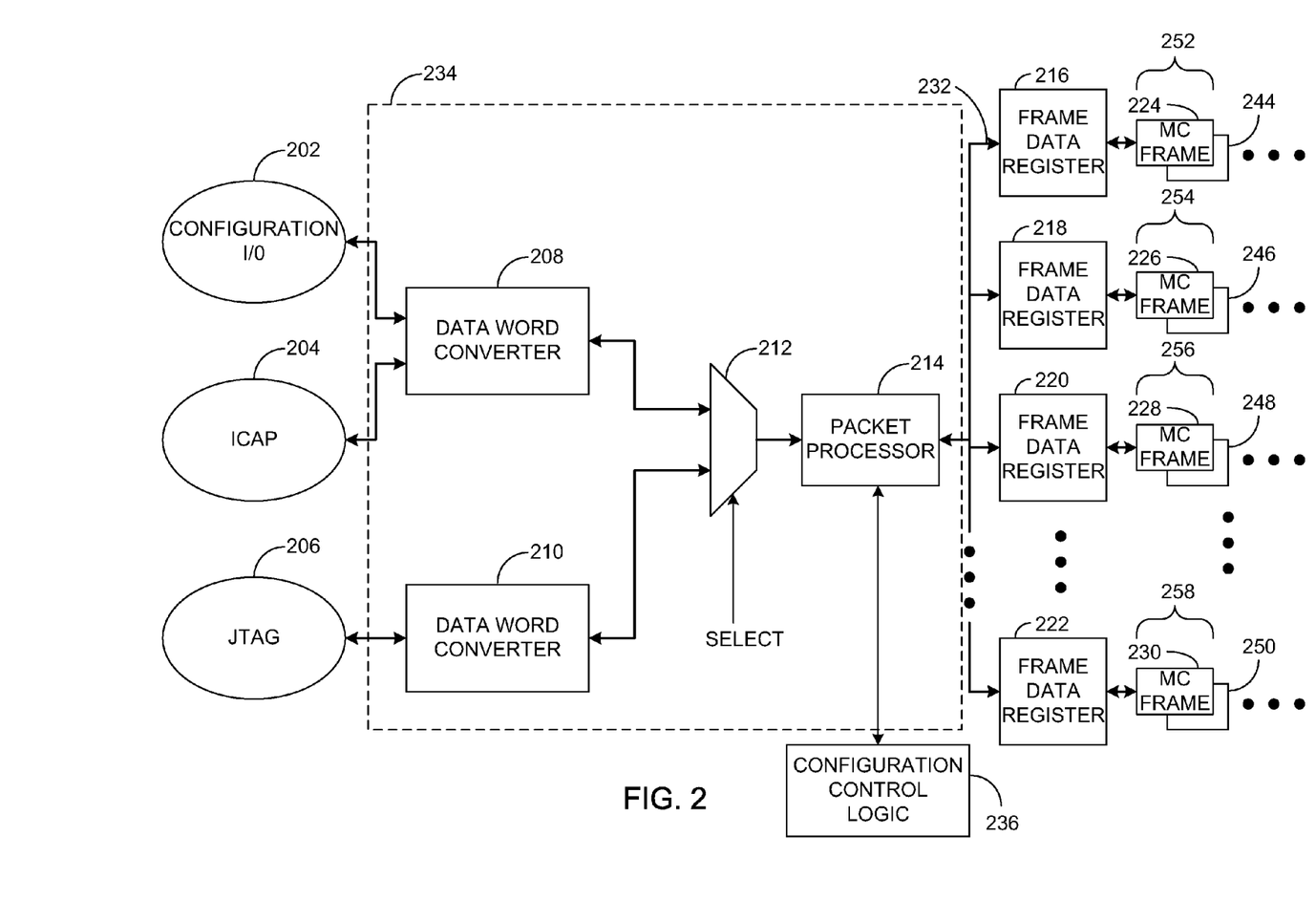
FIG. 2 illustrates a programmable logic device (PLD) configuration controller, in accordance with an embodiment of the present invention.

Turning to FIG. 2, a PLD configuration controller is exemplified, whereby configuration data router 234 facilitates the propagation of configuration data into the configuration memory space that is comprised of frame data registers 216-222 and memory cell frame sets 252-258 of a PLD, such as FPGA 100. Configuration data router 234 is comprised of data word converters 208-210, multiplexer 212, and packet processor 214. To program the configuration memory space, instructions for configuration control logic 236 and data for the configuration memory space are provided in the form of a configuration bitstream, which is delivered to configuration control logic 236 and the configuration memory space via configuration data router 234.

Configuration memory is arranged in multiple sets of memory cell frames that are tiled about FPGA 100, whereby each memory cell frame set represents an entire row of configuration memory cells. For example, the first memory cell frame 224 of memory cell frame set 252 configures the first column of the first row of configuration memory cells within the configuration memory space, the second memory cell frame (not shown) of memory cell frame set 252 configures the second column of the first row of configuration memory cells within the configuration memory space, and so on.

The first memory cell frame 226 of memory cell frame set 254 configures the first column of the second row of configuration memory cells within the configuration memory space, the second memory cell frame (not shown) of memory cell frame set 254 configures the second column of the second row of configuration memory cells within the configuration memory space, and so on. The remaining memory cell frame sets 256-258 are similarly arranged, such that memory cell frame set 256 configures the multiplicity of columns contained within the third row of the configuration memory space and memory cell frame set 258 ultimately configures the multiplicity of columns contained within the last row of the configuration memory space.

Each configuration memory cell frame of the configuration layer controls the logic configuration of its corresponding logic frame on the logic layer. For example, memory cell frame 224 controls the logic and interconnect configuration of logic frame 244 that exists on the logic layer of, e.g., FPGA 100. Similarly, memory cell frames 226-230 control the logic and interconnect configuration of logic frames 246-250, respectively, that also exist on the logic layer of, e.g., FPGA 100.

The height of each frame of memory cells is determined by the particular generation of PLD. Earlier FPGAs, for example, require the height of the configuration memory cell frames to be equal to the height of the device itself. More recent FPGA generations, however, divide the height of the device into two or more rows, whereby each configuration memory cell frame is mapped into a configuration memory cell column and a configuration memory cell row as discussed above. In such an instance, a single frame of configuration data is addressed to a particular column and row within the configuration memory space, whereby each single frame of configuration data is comprised of, for example, 41, 32-bit data words for a total of 1312 bits per configuration memory frame. It is understood, however, that configuration memory frame sizes are device dependent and may be adapted to be any size as may be required by the particular device being configured.

Each configuration memory cell frame is the smallest addressable segment of the configuration memory space. Therefore, all configuration operations are required to act upon an integer number of configuration memory cell frames. Furthermore, each configuration memory cell frame, e.g., configuration memory cell frames 224-230, is mapped into a portion of configurable logic, e.g., logic frames 244-250, that is bounded by a configuration memory cell column and a configuration memory cell row as discussed above. As such, configuration of an FPGA using the configuration controller of FIG. 2 is accomplished sequentially, whereby the configuration bitstream delivered by configuration data router 234 is addressable to only one of configuration memory cell frame sets 252-258 at a time.

Configuration I/O 202, for example, may be configured to transfer the configuration bitstream either serially, or in configurable data widths of, e.g., 8, 16, or 32 bits. In particular, configuration I/O 202 may include a serial configuration programmable read only memory (PROM) that stores the configuration data and then transfers the configuration data to FPGA 100 in response to a configuration clock signal. In a serial transfer mode, a single configuration bit may be transferred for each configuration clock cycle. Conversely, a parallel transfer mode may be used to transfer the configuration data in multiple bit data words, e.g., 8, 16, or 32-bit data words, for each configuration clock cycle.

Data word converter 208 then receives the configuration data from configuration I/O 202 and converts the configuration data into a pre-determined word width of, for example, 32 bits, where the pre-determined word width is selected to be compatible with multiplexer 212, packet processor 214, and frame data registers 216-222. Packet processor 214 then sequentially transfers a frame of configuration data words, e.g., 41, 32-bit configuration data words, to one of frame data registers 216-222 that is addressed by configuration control logic 236, where the addressed frame data register corresponds to the row of the configuration memory space that is being reconfigured. The addressed frame data register then transfers the configuration data frame to the memory cell frame that is addressed by configuration control logic 236, where the addressed memory cell frame corresponds to the particular column of the particular row of the configuration memory space that is being configured.

Once the entire configuration bitstream has been transferred to the configuration memory space, configuration data router 234 may be configured for read mode during readback verify. In particular, a capture pulse may be transmitted via configuration control logic 236, which in turn causes configuration data to be latched from logic frames 244-250 to the corresponding memory cell frames 224-230. Subsequently, a software program, hardware block, or receiving device (not shown) that is coupled to configuration I/O 202 may read memory cell frames 224-230 to discover the logic values contained within logic frames 244-250 when the capture pulse was issued. The received configuration data may then be compared to the original configuration data so as to identify any corrupted configuration data bits that may exist within the configuration memory space.

In addition, a subset of the state data contained within CLBs and IOBs of configurable logic frames 244-250, e.g., flip-flop data, may be obtained in a similar manner during readback capture. In particular, once the capture pulse is provided by configuration control logic 236, a subset of state data contained within the CLBs and IOBs of configurable logic frames 244-250 is first downloaded into the corresponding memory cell frames, e.g., 224-230, respectively. The state data may then be uploaded into a software program, hardware block, or receiving device (not shown) that is coupled to configuration I/O 202 to decode the received state data and to perform any debug/inspection sessions that may be necessary.

The readback capture sequence performed in the manner described above retrieves a portion of the state data that is associated with the CLBs and IOBs of the entire PLD, unless otherwise "masked" from the readback capture procedure. In addition, the readback capture sequence performed in this manner is initiated by the configuration controller using a single capture pulse. As such, readback capture may not be directed to any single user logic region, but is rather directed globally to all user logic regions.

As discussed above, instructions for configuration control logic 236 and data for the configuration memory space are provided in the form of a configuration bitstream, which is delivered to FPGA 100 via configuration data router 234. Internal configuration access port (ICAP) 204 provides an alternate configuration interface, which is internal to FPGA 100. ICAP 204, therefore, obviates the need to use an external configuration interface as discussed above in relation to configuration I/O 202. Instead, ICAP 204 represents an internally accessed resource containing configuration data, which is then processed into configuration data frames as discussed above. Readback verify and readback capture may also be implemented via ICAP 204 using the read mode procedure of configuration data router 234 as discussed above.

Joint test action group (JTAG) interface 206 supports configuration of FPGA 100 in accordance with the IEEE 1532 standard for in-system configuration (ISC), based on the IEEE 1149.1 standard. JTAG interface 206 provides a single pin that provides the serial input to all JTAG and instruction registers (not shown) in response to the JTAG test clock signal. An instruction register (not shown) is then used to receive an operational code that configures JTAG interface 206 for an ISC operation, whereby the serial input provided by JTAG interface 206 provides the configuration bitstream to data word converter 210. The serial configuration bitstream is then converted to, e.g., 32-bit words, via data word converter 210, similarly as discussed above in relation to data word converter 208. The configuration data words are then provided to packet processor 214 via multiplexer 212 for sequential distribution to frame data registers 216-222 and memory cell frame sets 252-258 as discussed above. Readback verify and readback capture may also be implemented via JTAG 206 using the read mode procedure of configuration data router 234 as discussed above.

Figure 3:
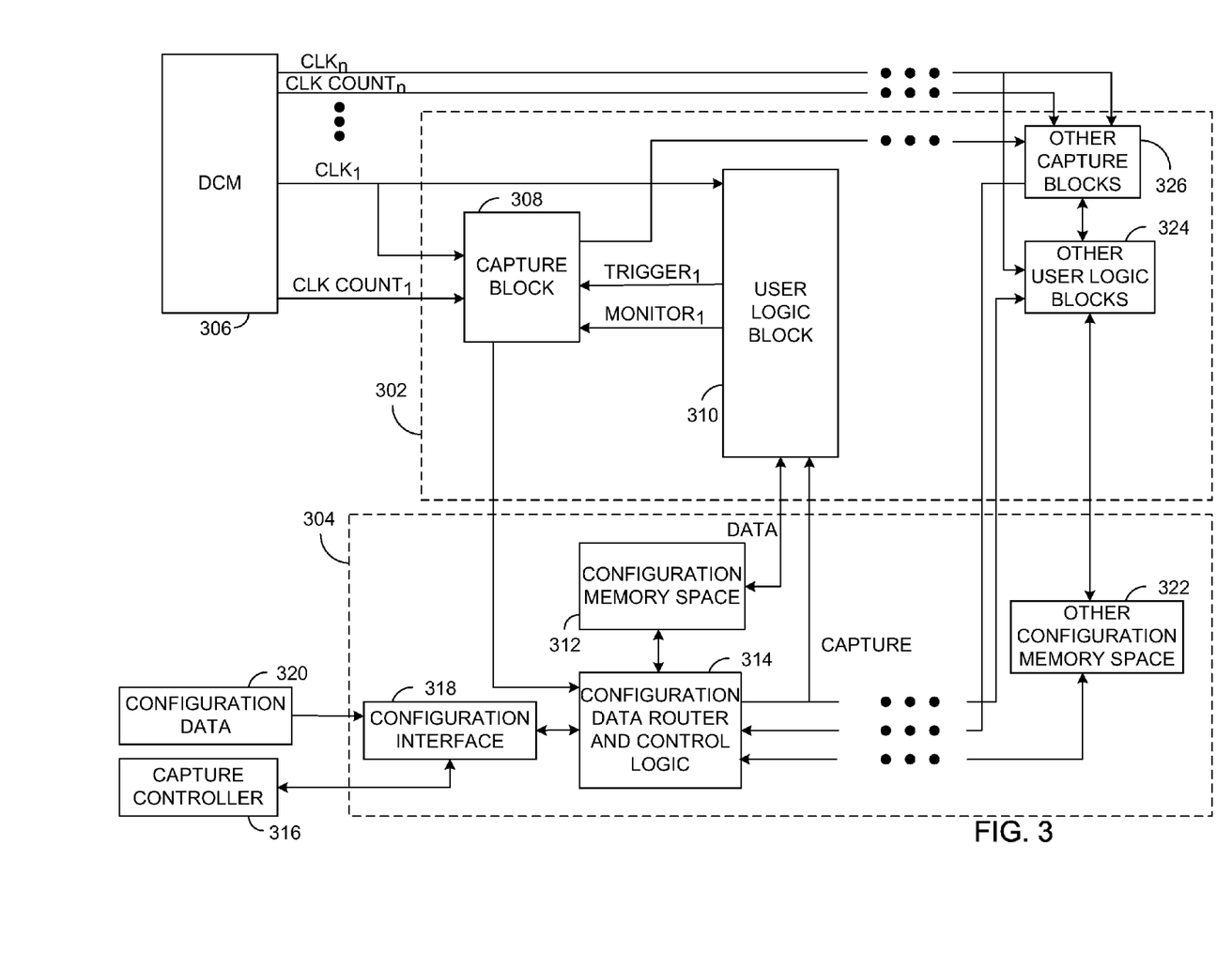
FIG. 3 illustrates a block diagram of a readback capture mechanism, according to an embodiment of the present invention.

Turning to FIG. 3, an exemplary block diagram of a readback capture mechanism is illustrated. Logic portion 302 exemplifies a portion of the configurable user logic and capture blocks that may exist within FPGA 100, whereas configuration portion 304 exemplifies a portion of the configuration memory space and associated configuration controller that defines the logic and interconnect within logic portion 302. User logic block 310 and other user logic blocks 324 may represent any size logic block that may exist within FPGA 100, the smallest of which may comprise a single configuration frame controlling, e.g., 16 CLBs.

User logic block 310 and capture block 308 are configured during a configuration event, as discussed above in relation to FIG. 2, whereby configuration data router and control logic 314 is configured for write mode. In such an instance, configuration data 320 is downloaded as a configuration bitstream via configuration interface 318 into configuration memory space 312, where configuration interface 318 may be implemented as any one of configuration interfaces 202-206 as discussed above in relation to FIG. 2. Once configured, the logic and interconnect of user logic block 310 and capture block 308 of the logic layer of FPGA 100 may be fully defined.

As illustrated, capture block 308 is integrated within logic portion 302 of the logic layer and is dedicated to user logic block 310 to enable enhanced readback capture capabilities within logic portion 302 that otherwise are not possible using the configuration controller of FIG. 2. In a first embodiment, user logic block 310 may initiate a readback capture event via signal TRIGGER$_1$ whereby upon assertion of signal TRIGGER$_1$ capture block 308 causes configuration control logic 314 to assert the capture pulse. In response, a subset of state data from user logic block 310 may be latched into the corresponding memory cells of configuration memory space 312. As such, signal TRIGGER$_1$ may act as a trigger signal asserted by user logic block 310 to begin an immediate readback capture sequence.

In an alternate embodiment, user logic block 310 and capture block 308 may interoperate to provide enhanced readback capture initiation. In particular, capture block 308 may be configured to monitor the state information of user logic block 310 during user defined operations of FPGA 100 using signal MONITOR$_1$. Given that the arbitrarily defined logic state, or sequence of logic states, of user logic block 310 is reached, capture block 308 causes configuration control logic 314 to assert the capture pulse. In response, a subset of state data from user logic block 310 may be latched into the corresponding memory cells of configuration memory space 312. In such an instance, capture block 308 monitors a richer dataset through signal MONITOR$_1$ to evaluate hardened trigger condition expressions before causing configuration control logic 314 to assert the capture pulse.

Other capture blocks 326 may be similarly configured within logic portion 302 so as to implement a dedicated capture block for each user logic region, e.g., other user logic blocks 324, that may be configured within logic portion 302. As discussed above, other user logic blocks 324 may be defined by one or more configuration data frames, where the configuration data that is used to define other logic blocks 324 is addressed to one or more columns and rows within other configuration memory space 322. It can be seen, therefore, that independent trigger mechanisms may be established for each user logic region, whereby readback capture from one user logic region does not corrupt the trigger and subsequent readback capture from another user logic region.

In an alternate embodiment, trigger signals of a first logic region may be cascaded to other capture blocks that are not associated with the first logic region. For example, once capture block 308 either receives signal TRIGGER$_1$, or determines that a logic state, or sequence of logic states, of user logic region 310 is reached by evaluation of signal MONITOR$_1$, capture block 308 may arm the triggering mechanism of other capture blocks 326. Once armed, other capture blocks 326 may monitor the respective TRIGGER and/or MONITOR signals of other user logic blocks 324 for cascaded readback capture functionality, whereby a subset of state data from other user logic blocks 324 may be latched into other configuration memory space 322 at least in partial response to the triggering of user logic block 310.

In an alternate embodiment, arming functionality may be associated with DCM 306 (or equivalently a phase-locked loop or a combination of the two), whereby for example, the trigger mechanism of capture blocks 308 and/or 326 is armed after an arbitrary number of clock cycles have elapsed. For example, DCM 306 may provide one or more clock count triggers, e.g., CLK COUNT$_1$ through CLK COUNT$_n$, that correspond to the various phase variants of clock signals, e.g., CLK$_1$ through CLK$_n$, that are provided by DCM 306. In such an instance, DCM 306 may provide one or more clock count trigger signals after an arbitrary number of clock cycles have occurred for the corresponding one or more DCM clock output signals.

In such an instance, capture blocks 308 and 326 may be configured to utilize clock count trigger signals CLK COUNT$_1$ through CLK COUNT$_n$, respectively, as arming signals. In particular, assertion of a clock count trigger signal causes the corresponding capture block to begin monitoring of the TRIGGER and/or MONITOR signals of its respective user logic block. In such an instance, capture blocks 308 and 326 may initiate a readback capture sequence only in response to first being armed by clock count trigger signals CLK COUNT$_1$ or CLK COUNT$_n$, respectively.

It can be seen, therefore, that multiple trigger points may be established within logic portion 302, so as to enable independent readback capture events for each user logic block that is established within FPGA 100. While capture controller 316 is reading back the state data of user logic block 310 via configuration interface 318 in response to signals TRIGGER$_1$ and/or MONITOR$_1$, trigger events and corresponding state data within other user logic blocks 324 may continue to be monitored and captured by other capture blocks 326 and other configuration memory space 322 without corrupting the state data obtained from user logic block 310. In other words, the subset of state data contained within CLBs 102 and IOBs 104 that are associated with user logic blocks 310 and 324 may be temporarily stored within configuration memory spaces 312 and 322, respectively, and subsequently accessed by capture controller 316 during debug/inspection operations as necessary.

Figure 4A:
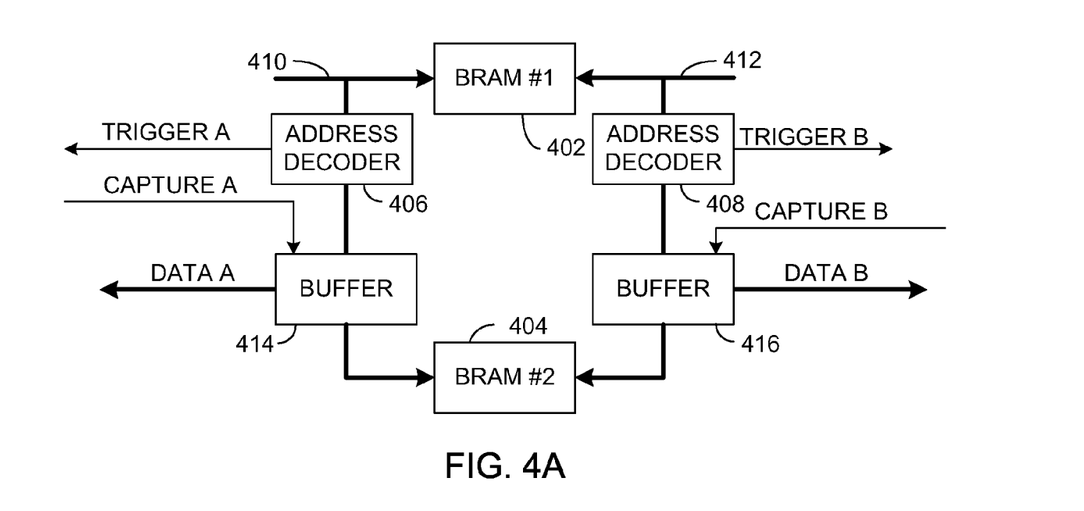
FIGS. 4A and 4B illustrate block diagrams of alternate implementations of the user logic blocks of FIG. 3, in accordance with embodiments of the present invention.

Turning to FIG. 4A, an alternate embodiment is exemplified, whereby user logic blocks 310 and/or 324 are at least partially implemented using BRAMS 103 as discussed above in relation to FIG. 1. In particular, the BRAM configuration of FIG. 4A illustrates one embodiment, whereby BRAM 402 and BRAM 404 are configured as a BRAM pair. In such an instance, either of BRAM 402 or 404 is identified as the primary memory that is utilized for user logic operations and the other BRAM is identified as the target memory that is utilized for debug/inspection operations. Write operations are conducted on each of BRAMs 402 and 404 such that the data contained within BRAM 402 is substantially identical to the data contained within BRAM 404.

BRAM 402 and BRAM 404 are exemplified as dual-port BRAMs, whereby data/address write bus 410 and data/address write bus 412 each access memory space within BRAMs 402 and 404 simultaneously. Capture block 308 monitors write address activity via signals TRIGGER A and TRIGGER B to obtain the decoded address from address decoders 406 and 408, respectively, to detect that a particular memory space within the primary BRAM, e.g., BRAM 402, is being written during a user logic operation. In response, capture block 308 alerts configuration control logic 314 that a trigger point has been reached. Configuration control logic 314 then asserts signals CAPTURE A and/or CAPTURE B to temporarily suspend write operations to BRAM 404 via buffers 414 and 416, respectively.

Upon assertion of signal CAPTURE A, for example, buffer 414 write protects BRAM 404 and directs the data from write bus 410 to configuration memory space 312 as signal DATA A. As such, BRAM 404 no longer mirrors the data contained within BRAM 402, since the write operation performed by write bus 410 on BRAM 402 is not also performed on BRAM 404. Similarly, upon assertion of signal TRIGGER B, buffer 416 write protects BRAM 404 and directs the data from write bus 412 to configuration memory space 312 as signal DATA B. As such, BRAM 404 no longer mirrors the data contained within BRAM 402, since the write operation performed by write bus 412 on BRAM 402 is not also performed on BRAM 404.

Once the capture data is latched within configuration memory space 312, capture controller 316 may then retrieve the captured data for debug/inspection operations as necessary. Deassertion of signals CAPTURE A and/or CAPTURE B causes the reactivation of BRAM 404 and buffers 414 and/or 416 to perform write operations on BRAM 404 until the data contained within BRAM 404 is once again coherent, or synchronized, with the data contained within BRAM 402.

Figure 4B:
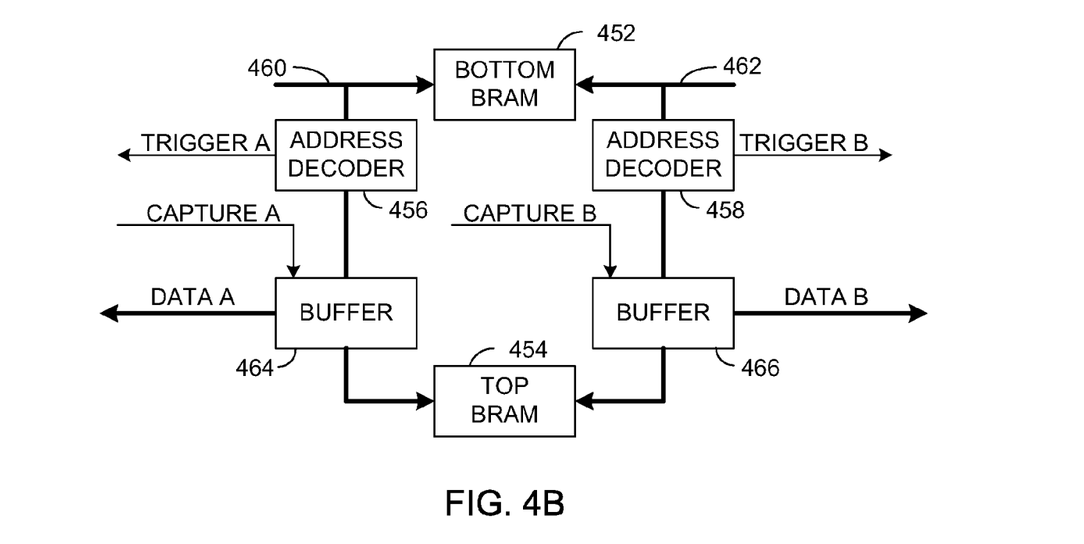

In an alternate embodiment, as exemplified in FIG. 4B, a single BRAM is utilized having bottom half memory space 452 and top half memory space 454 and associated data/address write buses 460 and 462, respectively. Bottom half memory space 452 is the primary memory that is utilized for user logic operations and top half memory space 454 is identified as the target memory that is utilized for debug/inspection operations. In such an instance, write operations are conducted such that the data contained within bottom half memory space 452 is substantially identical to the data contained within top half memory space 454. Decoders 456 and 458 negate the most-significant bit of the BRAM address bus so as to properly distinguish write operations between bottom half memory space 452 and top half memory space 454.

Operations conducted by capture block 308 using signals TRIGGER A and TRIGGER B receive the decoded address from address decoders 406 and 408, respectively, to detect that a particular memory space within, e.g., bottom half memory space 452 is being written during a user logic operation. In response, capture block 308 alerts configuration control logic 314 that a trigger point has been reached. Configuration control logic 314 then asserts signals CAPTURE A and/or CAPTURE B to temporarily suspend write operations to top half memory space 454 via buffers 464 and 466, respectively.

Upon assertion of signal CAPTURE A, for example, buffer 464 write protects top half memory space 454 and directs the data from write bus 460 to configuration memory space 312 as signal DATA A. As such, top half memory space 454 no longer mirrors the data contained within bottom half memory space 452, since the write operation performed by write bus 460 on bottom half memory space 452 is not also performed on top half memory space 454. Similarly, upon assertion of signal CAPTURE B, buffer 466 write protects top half memory space 454 and directs the data from write bus 462 to configuration memory space 312 as signal DATA B. As such, top half memory space 454 no longer mirrors the data contained within bottom half memory space 452, since the write operation performed by write bus 462 on bottom half memory space 452 is not also performed on top half memory space 454.

Once the capture data is latched within configuration memory space 312, capture controller 316 may then retrieve the captured data for debug/inspection operations as necessary. Deassertion of signals CAPTURE A and/or CAPTURE B reactivates top half memory space 454 and buffers 464 and/or 466 to perform write operations on top half memory space 454 until the data contained within top half memory space 454 is once again coherent, or synchronized, with the data contained within bottom half memory space 452.

Figure 5:
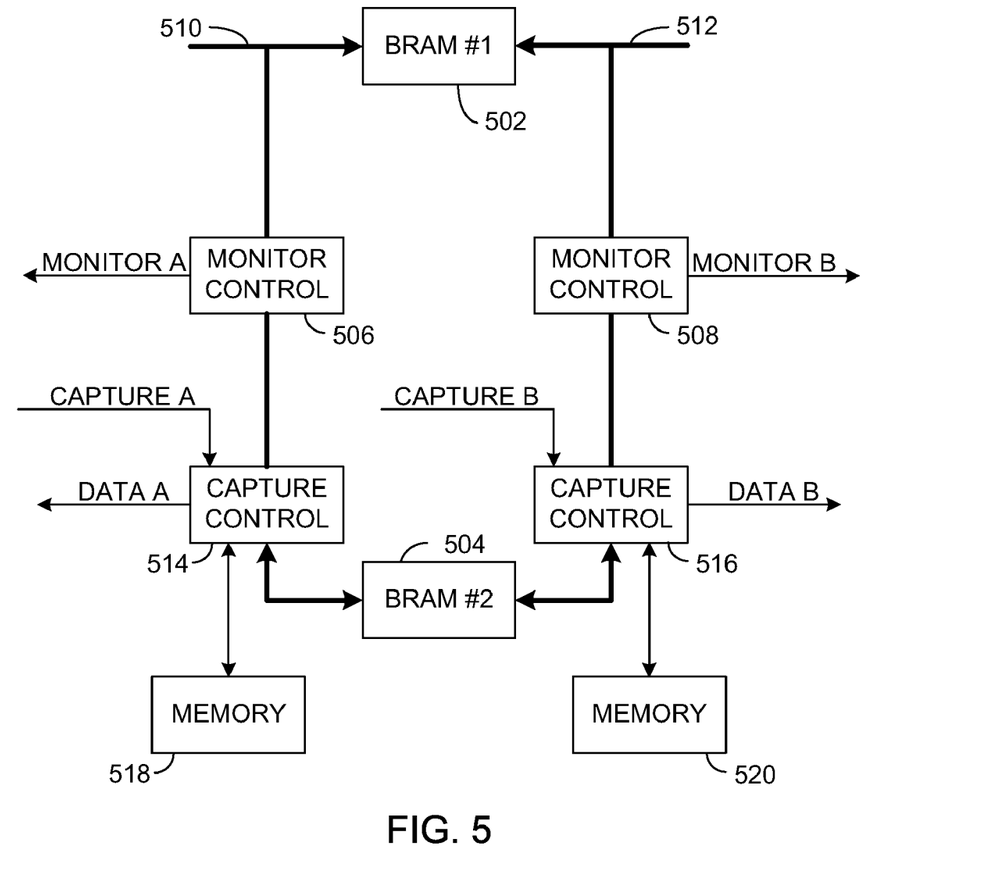
FIG. 5 illustrates a block diagram of the readback monitor and capture controls of the readback capture mechanism of FIG. 3 in accordance with an embodiment of the present invention.

Turning to FIG. 5, monitor control blocks 506, 508 combine with capture control blocks 514, 516 to provide enhanced monitor and capture operations, whereby combinations of hard logic and soft logic may be utilized to implement monitor control blocks 506, 508 and capture control blocks 514, 516. In a first embodiment, for example, a first portion of BRAM 504 may initially be allocated as the shadow memory for BRAM 502 transactions, while a second portion of BRAM 504 may be allocated as the shadow memory for BRAM 502 during a readback capture sequence.

That is to say, in other words, that capture control blocks 514, 516 may initially configure, e.g., the bottom half of BRAM 504, to store all data that is written to BRAM 502 during a capture mode of operation, i.e., the bottom half of BRAM 504 shadows the data written into BRAM 502. Once signals CAPTURE A and/or CAPTURE B are asserted by, e.g., configuration control logic 314 of FIG. 3 thus signifying the beginning of a readback capture event, capture control blocks 514, 516 transparently configure the top half of BRAM 504 as the new shadow memory to receive all subsequent data that is written to BRAM 502. In such an instance, the bottom half of BRAM 504 is made accessible to configuration memory space 312 via the read port of BRAM 504 during readback capture to facilitate retrieval of the shadow data that exists in the bottom half of BRAM 504. In addition, the shadowing of BRAM 502 write operations simultaneously continues by utilizing the top half of BRAM 504 as the shadow memory.

Once signals CAPTURE A and/or CAPTURE B are reasserted, thus signifying the beginning of another readback capture event, capture control blocks 514, 516 transparently configure the bottom half of BRAM 504 as the new shadow memory to receive all subsequent data that is written to BRAM 502. In such an instance, the top half of BRAM 504 is made accessible to configuration memory space 312 to retrieve the shadow data that exists in the top half of BRAM 504 via the read port of BRAM 504 while the shadowing of BRAM 502 write operations continues by utilizing the bottom half of BRAM 504. It can be seen, therefore, that BRAM 504 may be configured by capture control blocks 514, 516 to simultaneously support both data shadowing and readback capture roles without loss of data synchronization with BRAM 502.

In an alternate embodiment, capture control blocks 514, 516 may employ a journaling mechanism, whereby shadowing of BRAM 502 may be continued during a readback capture event. In operation, capture control blocks 514, 516 each store an initial copy of the data contents of BRAM 502 into memory blocks 518, 520, respectively, to begin a capture mode sequence. Monitor control blocks 506, 508 may then monitor the write operations to BRAM 502 during the capture mode sequence to generate a log of the data updates to BRAM 502. Each update log is then provided to capture control blocks 514, 516 to be written into BRAM 504 at various intervals as defined by capture control blocks 514, 516, such that BRAM 504 acts as a first-in, first-out (FIFO) for update logs. It is understood that each update log may not necessarily correspond to write operations associated with a single memory location within BRAM 502, but rather may involve multiple memory locations within BRAM 502.

During readback capture, capture control blocks 514, 516 may apply each update log to the initial copy of BRAM 502 data contents contained within memory blocks 518, 520, respectively, to maintain synchronization of the initial copy of BRAM 502 to the final data contents of BRAM 502. Once synchronized, capture control blocks 514, 516 upload the synchronized state data to configuration memory space 312. Capture controller 316 may then read the synchronized state data from configuration memory space 312 for debug/inspection operations as necessary.

In one embodiment, an update log may be generated for each write operation into BRAM 502, whereby signals MONITOR A and MONITOR B are asserted in response to the assertion of the write enable pin of BRAM 502 via bus 510 and/or 512. In response, an update log is pushed onto BRAM 504 in FIFO fashion, such that the most recent update log exists at the top memory slot of BRAM 504 and all previous update logs are pushed into their next available memory slot. It can be seen, therefore, that while update logs are pushed onto the top memory slots of BRAM 504 during the capture sequence, update logs may be simultaneously popped off the bottom memory slots of BRAM 504 during readback capture. Thus, the capture and readback capture sequences may be simultaneously operational.

Capture control blocks 514, 516 may employ features to ensure that data underrun and overrun within BRAM 504 are non-existent. For example, capture control blocks 514, 516 may determine whether an update log already exists within BRAM 504 that corresponds to the current BRAM 502 write operation. If a correspondence exists, then capture control blocks 514, 516 may pop update logs off of BRAM 504 until the corresponding update log is retrieved from BRAM 504. Capture control blocks 514, 516 may then disregard the corresponding update log retrieved from BRAM 504 in favor of the update log generated in response to the current write operation into BRAM 502. Capture control blocks 514, 516 may then synchronize the local copy of BRAM 502 data contents with the popped update logs in preparation for upload to capture controller 316 via signals DATA A and DATA B to complete the readback capture sequence.

Data overrun and underrun may also be precluded through frequent BRAM 504 flush cycles. That is to say in other words, that capture control blocks 514, 516 may pop update logs off of BRAM 504 at regular intervals. Capture control blocks 514, 516 may then employ an update log tagging mechanism, whereby capture control blocks 514, 516 track the number of update logs currently existing within BRAM 504 to restrict the number of update logs popped off of BRAM 504 to be less than or equal to the number of update logs currently existing within BRAM 504.

In an alternate embodiment, associative caching may be employed by capture control blocks 514, 516. In particular, BRAM 504 may be utilized as an associative cache by capture control blocks 514, 516, whereby write operations into BRAM 502 are associatively written into the appropriate cache line within BRAM 504. Capture control blocks 514, 516 may then determine whether a cache line already exists within BRAM 504 that corresponds to the write operation within BRAM 502.

For example, if consecutive write operations within BRAM 502 are imposed upon the same memory location of BRAM 502, then capture control blocks 514, 516 may overwrite the cache line entry within BRAM 504 that corresponds to the write operation conducted within BRAM 502. As such, memory space within BRAM 504 may be conserved and optimized for use by capture control blocks 514, 516. During readback capture, cache lines within BRAM 504 are delivered to configuration memory space 312, via signals DATA A and/or DATA B, which as discussed above, provides temporary storage of the cache lines during readback capture. Given that the size of each cache line within BRAM 504 may be configured to be smaller than a configuration data frame, multiple cache lines may be stored within configuration memory space 312 per BRAM configuration data frame read during readback capture. Memory space within BRAM 504 may be further conserved by causing each cache line access from BRAM 504 to be destructive, such that once the cache line is read, the cache line is deleted from BRAM 504.

As discussed above, monitor control blocks 506, 508 and capture control blocks 514, 516 may be implemented as a combination of hard and soft logic. Thus, independent triggering mechanisms may be employed for each BRAM pair, whereby hard logic monitoring mechanisms, e.g., BRAM 502 write enable detection, may be combined with customized soft logic monitoring mechanisms, e.g., BRAM 502 port A write enable vs. BRAM 502 port B write enable, to provide flexible triggering mechanisms for each BRAM pair.

Figure 6:
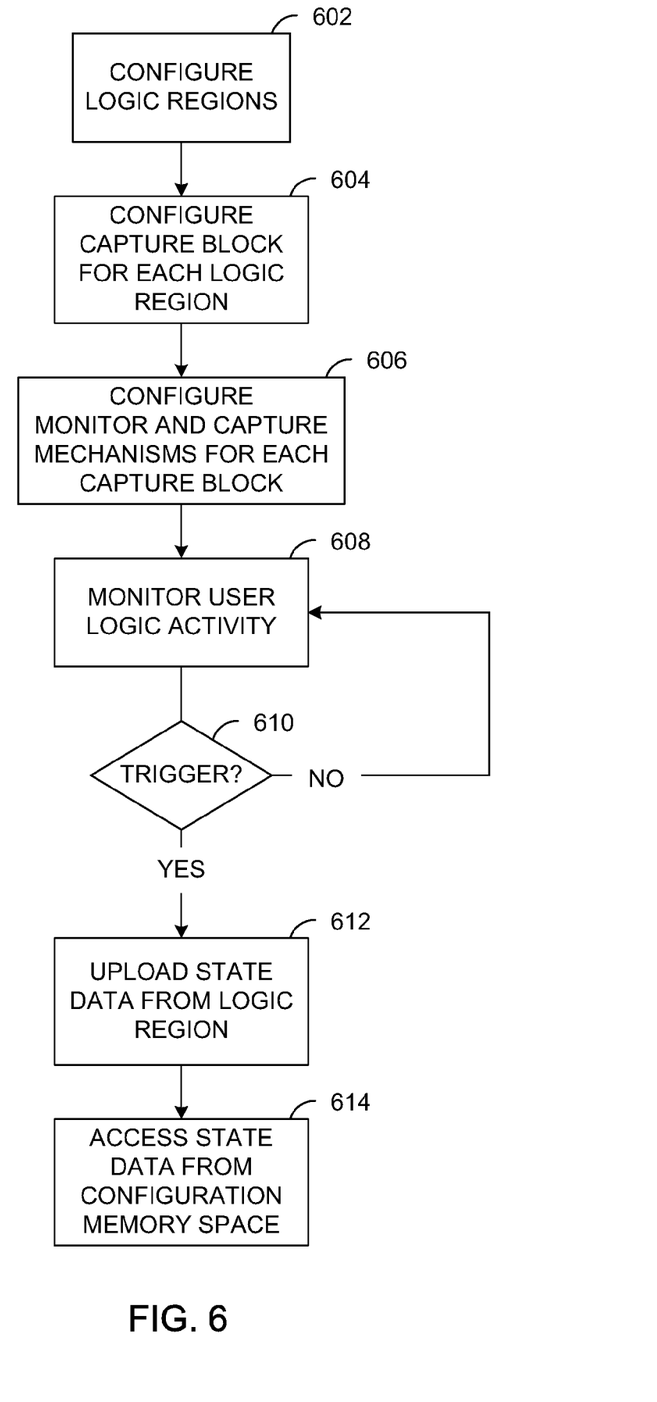
FIG. 6 illustrates a flow diagram of the configuration and utilization of the readback capture mechanisms of FIGS. 3-5 in accordance with an embodiment of the present invention.

Turning to FIG. 6, a flow diagram is exemplified in which readback capture mechanisms are first configured within one or more logic regions and then utilized to capture state data from each logic region during the course of user logic activity.

In steps 602-604, logic regions 310, 324 and capture blocks 308, 326 are configured during a configuration event, as discussed above in relation to FIG. 2, whereby configuration data router 314 is configured for write mode. In such an instance, configuration data 320 is downloaded as a configuration bitstream via configuration interface 318 into configuration memory space 312, 322 where configuration interface 318 may be implemented as any one of configuration interfaces 202-206 as discussed above in relation to FIG. 2. Once configured, the logic and interconnect of user logic blocks 310, 324 and capture blocks 308, 326 of the logic layer of FPGA 100 may be fully defined.

In step 606, monitor and trigger mechanisms associated with capture blocks 308, 326 are configured so as to facilitate state data uploads from logic blocks 310, 324. In one embodiment, capture functionality may be instantiated within DCMs, as discussed above in relation to FIG. 3, whereby trigger points may be specified to occur after an arbitrary number of clock cycles have elapsed as detected in step 608. For example, each DCM of FPGA 100 may provide one or more clock count triggers that correspond to the various phase variants of clock signals provided by the DCM. In such an instance, the DCM may provide a clock count trigger signal after an arbitrary number of clock cycles have occurred for a particular DCM clock output signal. Once received, capture blocks 308, 326 may utilize the clock count trigger as an arming signal for an additional triggering event that may be synchronous with the DCM clock output signal received by the logic region. In another embodiment, the same functions can be accomplished using PLLs to provide a clock count signal. In yet another embodiment, the clock signal is provided by configured fabric within the programmable logic. In still another embodiment, a combination of two or more of the above sources is used.

In alternate embodiments, capture mechanisms are instantiated within hard logic devices, such as BRAMs 402/404, 502/504, and BRAM portions 452, 454, so as to facilitate readback capture access to state data contained within the BRAMs as discussed above in relation to FIGS. 4A, 4B, and 5. In particular, the BRAM configuration of FIG. 4A illustrates one embodiment, whereby BRAM 402 and BRAM 404 are configured as a BRAM pair. In such an instance, either of BRAM 402 or 404 is identified as the primary memory that is utilized for user logic operations and the other BRAM is identified as the target memory that is utilized for debug/inspection operations. Write operations are conducted on each of BRAMs 402 and 404 such that the data contained within BRAM 402 is identical to the data contained within BRAM 404. Other embodiments utilize the shadowing BRAM to store only the changes, or update logs, to the primary BRAM, as discussed above in relation to FIG. 5.

Any number of triggering events may be utilized in step 610 to initiate readback capture while monitoring of user logic activity is conducted in step 608. For example, address decoders 406, 408 may be utilized to determine whether a particular memory space is accessed. Alternately, monitor control blocks 506, 508 and capture control 514, 516 blocks may be implemented as a combination of hard and soft logic. Thus, independent triggering mechanisms may be employed for each BRAM pair, whereby hard logic monitoring mechanisms, e.g., write and read enable detection, may be combined with customized soft logic monitoring mechanisms, e.g., port A write enable vs. port B write enable, to provide flexible triggering mechanisms for each BRAM pair.

In alternate embodiments, trigger points of multiple logic regions may be cascaded in step 610. For example, once a first capture block of a first logic region is triggered, a second capture block of a second logic block may be armed. Once the second capture block is triggered, then a third capture block of a third logic region is armed, and so on. As such, triggers may be cascaded throughout a user logic design to determine whether a trigger event has occurred in step 610.

In step 612, state data from user logic blocks 310, 324 is retrieved in response to the trigger of step 610 and delivered to configuration memory space 312, 322 for temporary storage. Capture controller 316 then accesses the state data from each of configuration memory spaces 312, 322 in step 614 to perform debug/inspection operations as necessary.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit device, comprising:
   a configuration data router coupled to receive at least one configuration data frame from a configuration interface;
   a configuration memory space coupled to the configuration data router and adapted to receive the at least one configuration data frame to define a user logic block and a capture block within the programmable logic device, the user logic block including,
      a monitor control block coupled to the capture block and adapted to report activity within the user logic block to the capture block, the capture block being adapted to assert an alert signal in response to the reported activity from the monitor control block; and
      a capture control block coupled to the configuration memory space and adapted to deliver state data contained within the user logic block to the configuration memory space in response to an asserted capture signal; and
   a configuration control logic block coupled to the capture block, the configuration control logic block being adapted to assert the capture signal in response to the asserted alert signal.

2. The integrated circuit device of claim 1, wherein the user logic block further comprises:
   a first random access memory portion adapted to store state data associated with the activity within the user logic block; and
   a second random access memory portion adapted to mirror the state data stored within the first random access memory portion.

3. The programmable logic device of claim 2, wherein the first and second random access memory portions are contained within a single random access memory device.

4. The integrated circuit device of claim 2, wherein the first random access memory portion is contained within a first random access memory device and the second random access memory portion is contained within a second random access memory device.

5. The integrated circuit device of claim 2, wherein the monitor control block comprises an address decoder, the address decoder being adapted to issue a trigger signal in response to a write operation associated with a memory location within the first random access memory portion.

6. The integrated circuit device of claim 5, wherein the capture control block comprises a buffer, the buffer being adapted to deliver state data associated with the write operation to the configuration memory space in response to the asserted capture signal, the buffer being further adapted to store the data associated with the write operation within the second random access memory portion in response to a deasserted capture signal.

7. The integrated circuit device of claim 1, wherein the user logic block further comprises:
- a first random access memory portion adapted to store state data associated with the activity within the user logic block;
- a second random access memory portion adapted to store changes to the memory contents of the first random access memory portion; and
- wherein the monitor control block is coupled to the first and second random access memory portions, the monitor control block being adapted to determine the changes to be stored within the second random access memory portion.

8. The integrated circuit device of claim 7, further comprising a memory block, the memory block being adapted to accept an initial copy of the memory contents of the first random access memory portion and further adapted to accept updates to the initial copy of the memory contents of the first random access memory portion in response to the changes stored within the second random access memory portion.

9. The integrated circuit device of claim 1, further comprising a clock count signal source coupled to each capture block and adapted to provide a clock count signal to each capture block, wherein the clock count signal enables each capture block to assert the respective alert signal.

10. The integrated circuit device of claim 9, wherein the clock count signal source is a digital clock manager.

11. A method for readback capturing integrated circuit device state data, the method comprising:
- configuring one or more logic regions within the integrated circuit device, each logic region of the one or more logic regions being configured to store state data relating to activity within each logic region;
- providing a monitor signal from each logic region, the monitor signal being indicative of the activity within each respective logic region;
- configuring a capture block for each logic region to receive the monitor signal, each capture block being responsive to assert an alert signal in response to specific activity within each respective logic region; and
- asserting a capture signal in response to the asserted alert signal to capture the state data of each logic region within a configuration memory space of each respective logic region.

12. The method of claim 11, wherein configuring logic regions comprises:
- configuring a first random access memory portion within each logic region to store the state data relating to activity within each logic region; and
- configuring a second random access memory portion within each logic region to mirror the data stored within the first random access memory portion.

13. The method of claim 12, wherein readback capturing integrated circuit device state data further comprises:
- transferring state data intended for the second random access memory portion to the configuration memory space in response to the asserted capture signal; and
- updating the second random access memory portion with the transferred state data in response to a deasserted capture signal.

14. The method of claim 12, wherein readback capturing integrated circuit device state data further comprises:
- reconfiguring the second random access memory portion within each logic region to store the state data relating to activity within each logic region in response to the asserted capture signal;
- transferring state data from the first random access memory portion to the configuration memory space in response to the asserted capture signal; and
- reconfiguring the first random access memory portion within each logic region to mirror the data stored within the second random access memory portion in response to the asserted capture signal.

15. The method of claim 11, wherein configuring logic regions comprises:
- configuring a first random access memory portion within each logic region to store the state data relating to activity within each logic region; and
- configuring a second random access memory portion within each logic region as a first-in, first-out buffer to store changes made to the data stored within the first random access memory portion.

16. The method of claim 15, wherein storing the changes made to the data stored within the first random access memory portion comprises storing log updates that correspond to changes to a plurality of memory locations within the first random access memory portion.

17. The method of claim 15, wherein storing the changes made to the data stored within the first random access memory portion comprises associatively storing data that corresponds to changes to a single memory location within the first random access memory portion.

18. The method of claim 15, wherein capturing the state data comprises:
- storing an initial copy of memory contents contained within the first random access memory portion;
- retrieving the changes from the second random access memory portion;
- synchronizing the initial copy of memory contents contained within the first random access memory portion to the retrieved changes to produce synchronized state data; and
- transferring the synchronized state data to the configuration memory space in response to the asserted capture signal.

19. The method of claim 18, further comprising simultaneously storing new changes to the second random access memory portion while retrieving old changes from the second random access memory portion.

20. An integrated circuit, comprising:
- a configuration data router coupled to receive a plurality of configuration data frames from a configuration interface;
- a plurality of configuration memory spaces coupled to the configuration data router, each configuration memory space being adapted to receive at least one configuration data frame to define a user logic block and a capture block associated with each configuration memory space, each user logic block includes,
- a monitor control block coupled to the capture block and adapted to report activity within the user logic block to the capture block, the capture block being adapted to provide an alert signal in response to the reported activity from the monitor control block; and
- a capture control block coupled to a respective configuration memory space and adapted to deliver state data contained within the user logic block to the respective configuration memory space in response to an asserted capture signal; and
- a capture controller coupled to each configuration memory space and adapted to retrieve the state data from each of the plurality of configuration memory spaces.

21. The integrated circuit of claim 20, wherein a plurality of capture blocks are coupled together so that an alert signal asserted by a first capture block enables the assertion of two or more alert signals from two or more capture blocks.

* * * * *